(12) United States Patent
Tao et al.

(10) Patent No.: US 11,671,023 B2
(45) Date of Patent: Jun. 6, 2023

(54) POWER SUPPLY CONTROL CIRCUIT FOR SWITCH MODE POWER SUPPLY CONVERTER AND POWER SUPPLY CONTROL METHOD USING THE SAME

(71) Applicant: Wuxi Chipown Microelectronics Co., Ltd., Jiangsu (CN)

(72) Inventors: Ping Tao, Wuxi (CN); Haijun Zhou, Wuxi (CN); Haisong Li, Wuxi (CN); Yangbo Yi, Wuxi (CN); Wei Gao, Wuxi (CN); Hongxing Li, Wuxi (CN)

(73) Assignee: Wuxi Chipown Microelectronics Co., Ltd., Wuxi (CN)

( * ) Notice: Subject to any disclaimer, the term of this patent is extended or adjusted under 35 U.S.C. 154(b) by 57 days.

(21) Appl. No.: 17/407,387

(22) Filed: Aug. 20, 2021

(65) Prior Publication Data
US 2021/0384839 A1 Dec. 9, 2021

(30) Foreign Application Priority Data
Apr. 29, 2021 (CN) .......................... 202110470874.3

(51) Int. Cl.
| | |
|---|---|
| H02M 3/335 | (2006.01) |
| H02M 3/158 | (2006.01) |
| H02M 1/00 | (2006.01) |
| G01R 19/165 | (2006.01) |
| H02M 1/36 | (2007.01) |
| H02M 3/00 | (2006.01) |

(52) U.S. Cl.
CPC .. *H02M 3/33576* (2013.01); *G01R 19/16538* (2013.01); *H02M 1/0006* (2021.05); *H02M 1/0009* (2021.05); *H02M 1/36* (2013.01); *H02M 3/003* (2021.05); *H02M 3/158* (2013.01)

(58) Field of Classification Search
CPC ............ H02M 3/33576; H02M 3/335; H02M 3/33507; H02M 3/33515; H02M 3/33523; H02M 3/158
See application file for complete search history.

(56) References Cited

U.S. PATENT DOCUMENTS

| | | | |
|---|---|---|---|
| 2008/0089100 A1* | 4/2008 | Park .................. | H02M 3/33515 363/21.01 |
| 2016/0111962 A1* | 4/2016 | Mao .................. | H02M 3/33507 363/21.16 |
| 2020/0127575 A1* | 4/2020 | Liu ..................... | G06F 13/4282 |

FOREIGN PATENT DOCUMENTS

CN 109039028 A 12/2018

* cited by examiner

*Primary Examiner* — Nguyen Tran

(57) ABSTRACT

A power supply control circuit for a switch mode power supply converter, and a power supply control method using the control circuit. The control circuit includes an auxiliary boosting unit, a main control unit and an auxiliary winding unit. The main control unit is configured to control the power switch in a power stage circuit to turn on or to be off, and to supply power to the auxiliary boosting unit. The auxiliary boosting unit is configured to provide auxiliary power for the main control unit, and to self-adaptively adjust the auxiliary boosting unit's own average switching frequency based on a load state of the main control unit. The auxiliary winding unit is configured to couple energy by means of a magnetic element in the power stage circuit, to generate an output voltage.

7 Claims, 4 Drawing Sheets

POWER SUPPLY CONTROL CIRCUIT FOR SWITCH MODE POWER SUPPLY CONVERTER AND POWER SUPPLY CONTROL METHOD USING THE SAME

CROSS-REFERENCE TO RELATED APPLICATIONS

The present application claims the priority of the Chinese Patent Application No. 202110470874.3, filed on Apr. 29, 2021, and titled POWER SUPPLY CONTROL CIRCUIT FOR SWITCH MODE POWER SUPPLY CONVERTER AND POWER SUPPLY CONTROL METHOD USING THE SAME, and the content of which is incorporated by reference herein in its entirety, the specification of which is incorporated by reference herein in its entirety.

TECHNICAL FIELD

The present disclosure relates to a power supply control circuit with an auxiliary power supply function and a power supply control method using the same, in particular, to a power supply control circuit for a switch mode power supply converter and a power supply control method using the same, and belongs to the technical field of switch mode power supply.

BACKGROUND

A switch mode power supply, especially a flyback switch mode power supply, is a basic electrical component widely used in various fields currently, and has advantages of small size, fast transient response, and low loss. With the popularity and the development of the miniaturized electronic products such as mobile phones and tablet computers in recent years, more and more charging adapters for these products have begun to support a quick charge protocol, that is, they can support widely ranged output voltages, such as 5V to 20V, and correspondingly, it is definitely possible that the power supply voltage of the switch mode power supply reaches 10V to 50V. As a result, not only the power consumption of the chip in the switch mode power supply will be greatly increased, but also a higher voltage withstanding performance of the chip will be required.

For those traditional switch mode power supplies that do not support the quick charge protocol, the power supply voltage of the chip in the switch mode power supply mainly relies on the output voltage of the auxiliary winding, and the output voltage of the auxiliary winding can also directly reflect the overall output voltage of the switch mode power supply. This traditional power supply mode is simple and easy to implement, and has low requirement for the voltage withstanding performance of the chip in the switch mode power supply. In view of the above two schemes, how to design a power supply scheme that is highly versatile and can meet both the power supply requirement of the switch mode power supply supporting the quick charge protocol and the power supply requirement of the traditional switch mode power supply has become a current technical difficulty.

In view of this problem, some corresponding technical solutions have been provided in the art. For example, a low-dropout (LDO) linear voltage regulator circuit is arranged between an output of the auxiliary winding and a power supply pin of the chip, to maintain the power supply voltage of the chip in the switch mode power supply at a relatively low value. Although this solution solves the problem of excessively high power supply voltage of the chip, simultaneously it causes a new problem that the power switch in the linear voltage regulator circuit overheats in a long time conductive state, so the actual application of this solution cannot achieve the intended effect.

In addition, there are also some application attempts of the switch mode power supply that supports the quick charge protocol in the art. For example, a China Patent No. 109039028B proposes a power adapter and a control circuit applied to the power adapter. The control circuit is provided with a built-in voltage conversion unit and a switch control unit, which can convert an output voltage of the auxiliary winding in the control circuit and adjust the output voltage to an appropriate voltage range. This configuration can better solve the problem of power consumption and voltage withstanding performance of the chip in the switch mode power supply with widely ranged output voltages. However, taking into consideration that an integrated inductor has a relatively large area and a relatively high cost and is not easy to be integrated into an internal circuit, during an actual assembly, two additional pins besides the original package pins need to be provided in the voltage conversion unit. One additional pin is used to detect the voltage of the auxiliary winding, and the other additional pin is used to connect an external inductor, thus increasing the number of package pins and increasing the difficulty of the packaging. On the other hand, for the traditional switch mode power supply, the adjustment of the power supply voltage can be achieved by simply controlling the output of the auxiliary winding, so the control circuit with the built-in voltage conversion unit and switch control unit appears to be "uneconomical" and has a poor universality in such an application scenario.

In summary, no matter what existing technology is, there are many problems to be solved and improved. Therefore, how to propose a new switch mode power supply technology based on the existing research to overcome the above defects has become an urgent problem to be solved by the skilled in the art.

SUMMARY

In view of the above defects in the prior art, an objective of the present disclosure is to provide a power supply control circuit for a switch mode power supply converter and a power supply control method using the power supply control circuit as follows.

A power supply control circuit for a switch mode power supply converter is applied in a power stage circuit of the switch mode power supply converter. The power stage circuit includes at least a magnetic element, a power switch transistor, a sampling resistor, and an output unit. The power supply control circuit for the switch mode power supply converter comprises at least an auxiliary boosting unit, a main control unit, and an auxiliary winding unit.

The main control unit is electrically connected to the power switch transistor in the power stage circuit and the auxiliary boosting unit, respectively, and is configured to control the power switch transistor to turn on and to be off, and to supply power to the auxiliary boosting unit.

The auxiliary boosting unit is arranged between the main control unit and the auxiliary winding unit, and is configured to provide auxiliary power supply for the main control unit, and to self-adaptively adjust the auxiliary boosting unit's own average switching frequency based on a load state of the main control unit.

When the auxiliary boosting unit is in a working state, and when a power supply voltage of the main control unit is lower than an internal set value of the main control unit, the auxiliary boosting unit converts an output voltage of the auxiliary winding unit into the power supply voltage of the main control unit, to adjust the power supply voltage of the main control unit not to be lower than the internal set value of the main control unit; when the auxiliary boosting unit is in a non-working state, the output voltage of the auxiliary winding unit is directly supplied to the main control unit.

The auxiliary winding unit is electrically connected to the auxiliary boosting unit, and is configured to couple energy by means of the magnetic element in the power stage circuit, to generate an output voltage.

In some embodiments, one side of the magnetic element is electrically connected to the power switch transistor and the sampling resistor in sequence. The sampling resistor is electrically connected to a common ground; the power switch transistor is electrically connected to the sampling resistor, and a connection position therebetween is a current sampling terminal of the power supply control circuit for the switch mode power supply converter. Another side of the magnetic element is electrically connected to the output unit.

In some embodiments, a first output of the main control unit is electrically connected to the power switch transistor, and a second output of the main control unit is electrically connected to the current sampling terminal.

In some embodiments, the auxiliary boosting unit is electrically connected to an input capacitor and an output power supply capacitor. The input capacitor is arranged between an input of the auxiliary boosting unit and an output of the auxiliary winding unit, and the output power supply capacitor is arranged between an output of the auxiliary boosting unit and an input of the main control unit. The input capacitor and the output power supplying capacitor are electrically connected to a common ground.

In some embodiments, the auxiliary boosting unit comprises at least an inductor, a first diode, a first switch, a second switch, a detection-and-control circuit and a current sub-unit.

A first terminal of the inductor is configured to be the input of the auxiliary boosting unit, and a second terminal of the inductor is electrically connected to an anode of the first diode, a first terminal of the first switch, and a second terminal of the second switch, respectively.

The anode of the first diode is electrically connected to the second terminal of the inductor, and a cathode of the first diode is configured to be the output of the auxiliary boosting unit and is electrically connected to an input of the current sub-unit and an input of the detection-and-control circuit respectively.

The first terminal of the first switch is electrically connected to the second terminal of the inductor, the anode of the first diode, and the second terminal of the second switch, respectively; a second terminal of the first switch is electrically connected to a common ground; a third terminal of the first switch is electrically connected to a first output of the detection-and-control circuit.

A first terminal of the second switch is electrically connected to an output of the current sub-unit, the second terminal of the second switch is electrically connected to the second terminal of the inductor, the anode of the first diode, and the first terminal of the first switch, respectively, and a third terminal of the second switch is electrically connected to a second output of the detection-and-control circuit.

The input of the detection-and-control circuit is electrically connected to the cathode of the first diode and the input of the current sub-unit, respectively. The first output of the detection-and-control circuit is electrically connected to the third terminal of the first switch, and the second output of the detection-and-control circuit is electrically connected to the third terminal of the second switch.

The input of the current sub-unit is electrically connected to the cathode of the first diode and the input of the detection-and-control circuit, respectively, and the output of the current sub-unit is electrically connected to the first terminal of the second switch.

In some embodiments, the auxiliary boosting unit includes at least an inductor, a first diode, a first switch, a second switch, a detection-and-control circuit, and a current sub-unit.

A first terminal of the inductor is configured to be the input of the auxiliary boosting unit and is electrically connected to a second terminal of the second switch, and a second terminal of the inductor is electrically connected to an anode of the first diode and a first terminal of the first switch, respectively.

The anode of the first diode is electrically connected to the second terminal of the inductor and the first terminal of the first switch, respectively. A cathode of the first diode is configured to be the output of the auxiliary boosting unit, and is electrically connected to the input of the current sub-unit and an input of the detection-and-control circuit, respectively.

The first terminal of the first switch is electrically connected to the second terminal of the inductor and the anode of the first diode, and a second terminal of the first switch is electrically connected to a common ground. A third terminal of the first switch is electrically connected to a first output of the detection-and-control circuit.

A first terminal of the second switch is electrically connected to an output of the current sub-unit, the second terminal of the second switch is electrically connected to the first terminal of the inductor, and a third terminal of the second switch is electrically connected to a second output of the detection-and-control circuit.

The input of the detection-and-control circuit is electrically connected to the cathode of the first diode and an input of the current sub-unit, respectively. The first output of the detection-and-control circuit is electrically connected to the third terminal of the first switch, and the second output of the detection-and-control circuit is electrically connected to the third terminal of the second switch.

The input of the current sub-unit is electrically connected to the cathode of the first diode and the input of the detection-and-control circuit, respectively, and the output of the current sub-unit is electrically connected to the first terminal of the second switch.

In some embodiments, the auxiliary winding unit includes at least an auxiliary winding, a second diode and a first resistor.

A first terminal of the auxiliary winding is electrically connected to an anode of the second diode, and a second terminal of the auxiliary winding is electrically connected to a common ground.

The anode of the second diode is electrically connected to the first terminal of the auxiliary winding, and a cathode of the second diode is electrically connected to a first terminal of the first resistor.

The first terminal of the first resistor is electrically connected to the cathode of the second diode, and a second terminal of the first resistor is configured to be an output of the auxiliary winding unit and is electrically connected to an input of the auxiliary boosting unit.

A power supply control method of a switch mode power supply converter, using the power supply control circuit for the switch mode power supply converter above, includes following steps:

starting and powering the circuit, starting the main control unit, and calibrating the internal set value of the main control unit;

the main control unit charging an output power supplying capacitor and suppling power to the auxiliary boosting unit, and at this time, a voltage of an input capacitor changing along with a change of a voltage of the output power supplying capacitor, and a positive-correlated trend existing therebetween;

a start-up of the main control unit ending, and the auxiliary boosting unit detecting the voltage of the output power supplying capacitor in real time and comparing the voltage of the output power supplying capacitor with the internal set value of the main control unit;

if the voltage of the output power supplying capacitor is not less than the internal set value of the main control unit, the auxiliary boosting unit being in the non-working state, and the output voltage of the auxiliary winding unit being directly supplied to the main control unit; otherwise the auxiliary boosting unit being in the working state, and adopting a self-adaptive conduction time control mode to self-adaptively adjust the auxiliary boosting unit's own average switching frequency based on the load state of the main control unit, so that the voltage of the output power supplying capacitor is not less than the internal set value of the main control unit.

The present disclosure mainly has following advantages:

The present disclosure discloses the power supply control circuit for the switch mode power supply converter and the corresponding power supply control method, which can be adjusted and modified according to different switch mode power supply converters to which the control circuit and the control method are applied, and have flexible and changeable application modes, rich application scenarios, and broad application prospects.

When the switch mode power supply converter supports the quick charge protocol or adopts widely ranged output voltages, the power supply control circuit of the present disclosure can convert the output voltage of the auxiliary winding into the voltage of the main control unit, and the auxiliary boosting unit can adopt the self-adaptive conduction time control mode, and by adjusting the average switching frequency, self-adaptively keeps the power supply voltage of the main control unit to be a relatively low value within a normal operating range. In this case, the configuration cost of hardware is reduced, the loss of the entire system is reduced, and the efficiency is improved, what's more, the requirements for the withstand voltage performance and the packaging process of the chip in the system are greatly reduced.

When the switch mode power supply converter does not support the quick charge protocol or does not adopt the widely ranged voltages, the power supply of the main control unit in the power supply control circuit of the present disclosure may be directly supplied by the auxiliary winding unit, or adopts a power supply mode with the auxiliary boosting unit. For the main control unit, the power supply mode may be selected freely and matched flexibly, thus making the application of the entire circuit structure more economical.

The present disclosure also provides a reference for other related issues in the art, and may be developed and expanded, and applied to related solutions of other switch mode power supply control technology in the art. The present disclosure has a very broad application prospect.

The specific embodiments of the present disclosure will be further described in detail hereafter combining with the accompanying drawings of the embodiments, to make the technical solutions of the present disclosure easier to understand and grasp.

DETAILED DESCRIPTION

The objective of the present disclosure is to provide a power supply control circuit for a switch mode power supply converter and a power supply control method using the control circuit. The specific solutions are as follows.

Figure 1:
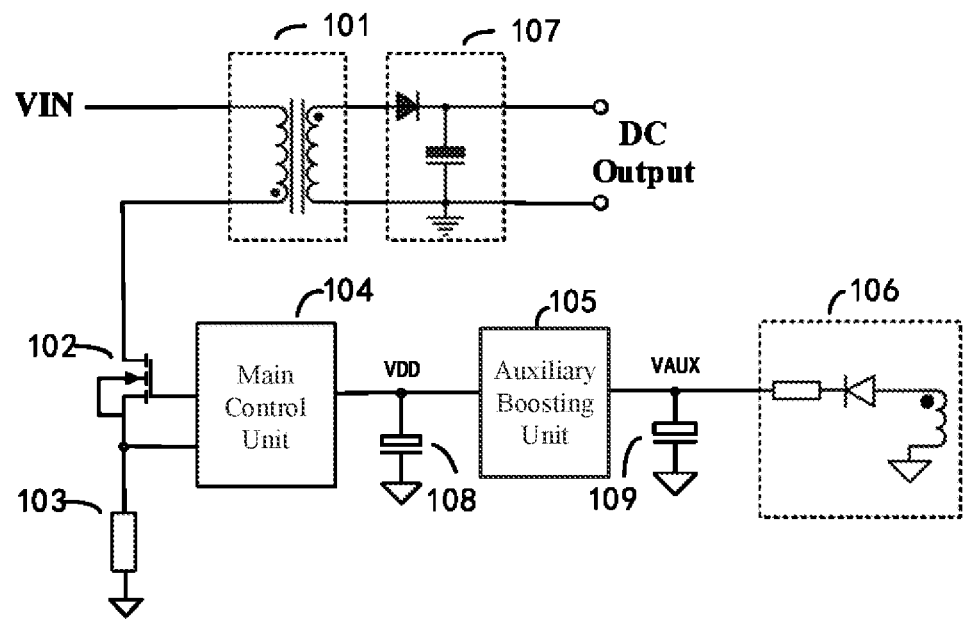
FIG. 1 is a schematic view illustrating an overall structure of a power supply control circuit for a switch mode power supply converter of the present disclosure.

As shown in FIG. 1, the present disclosure discloses a power supply control circuit for a switch mode power supply converter, which is applied to a power stage circuit of the switch mode power supply converter. The power supply control circuit for the switch mode power supply converter at least includes an auxiliary boosting unit 105, a main control unit 104, and an auxiliary winding unit 106.

The arrangement of the power stage circuit is similar to that in the prior art, and may be implemented in a plurality of forms, and preferably is a power stage circuit in a flyback switch mode power supply converter. The power stage circuit includes at least a magnetic element 101, a power switch transistor 102, a sampling resistor 103, and an output unit 107, and is configured to convert an input voltage of the switch mode power supply converter into an output voltage.

The magnetic element 101 may also be implemented in a plurality of manners. In this embodiment, the magnetic element 101 has a dual-winding structure configured to receive an input voltage. Specifically, one side of the magnetic element 101 is electrically connected to the power switch transistor 102 and the sampling resistor 103 in sequence. The sampling resistor 103 is electrically connected to a common ground. The power switch transistor 102 is electrically connected to the sampling resistor 103, and a connection position therebetween is a current sampling terminal of the power supply control circuit for the switch mode power supply converter. Another side of the magnetic element 101 is electrically connected to the output unit 107.

The main control unit 104 is electrically connected to the power switch transistor 102 and the auxiliary boosting unit 105 respectively, and is configured to control the power switch transistor 102 to turn on or to be off, and to supply power to the auxiliary boosting unit 105. The power supply voltage VDD of the main control unit 104 is a voltage on an output power supplying capacitor 108 connected to the output of the auxiliary boosting unit 105. When the main control unit 104 is in a start-up state, the main control unit 104 will charge the output power supplying capacitor 108 while supplying power to the auxiliary boosting unit 105.

The auxiliary boosting unit 105 is arranged between the main control unit 104 and the auxiliary winding unit 106. The auxiliary boosting unit 105 is configured to provide auxiliary power supply for the main control unit 104, and to adopt a self-adaptive conduction time control mode to self-adaptively adjust its own average switching frequency based on a load state of the main control unit 104.

Furthermore, during the start-up of the main control unit 104, the auxiliary boosting unit 105, by means of its internal logic circuit, enables a voltage of an input capacitor 109 connected to the input of the auxiliary boosting unit 105 to change along with a change of the output power supplying capacitor 108 connected to the output of the auxiliary boosting unit 105. When the auxiliary boosting unit 105 is in a working state, and when a power supply voltage of the main control unit 104 is lower than an internal set value of the main control unit 104, the auxiliary boosting unit 105 converts the output voltage of the auxiliary winding unit 106 into the power supply voltage of the main control unit 104, to adjust the power supply voltage of the main control unit 104 not to be lower than the internal set value of the main control unit 104. When the auxiliary boosting unit 105 is in a non-working state, the output voltage of the auxiliary winding unit 106 is directly supplied to the main control unit 104.

The auxiliary winding unit 106 is electrically connected to the auxiliary boosting unit 105, and is configured to couple energy of the input of the switch mode power supply converter by means of the magnetic element 101 in the power stage circuit, to generate an output voltage VAUX, which is capable of reflecting output characteristics of the voltage output from the power stage circuit. With respect to the configuration, the auxiliary winding unit 106 includes at least an auxiliary winding, a second diode, and a first resistor.

A first terminal of the auxiliary winding is electrically connected to an anode of a second diode, and a second terminal of the auxiliary winding is electrically connected to the common ground.

The anode of the second diode is electrically connected to the first terminal of the auxiliary winding, and a cathode of the second diode is electrically connected to a first terminal of the first resistor.

The first terminal of the first resistor is electrically connected to the cathode of the second diode, and a second terminal of the first resistor functions as an output of the auxiliary winding unit 106 and is electrically connected to an input of the auxiliary boosting unit 105.

The specific connection relationship between above components is as follows.

The input of the auxiliary boosting unit 105 is electrically connected to the output of the auxiliary winding unit 106. The output of the auxiliary boosting unit 105 is electrically connected to the input of the main control unit 104. A first output of the main control unit 104 is electrically connected to the power switch transistor 102, and a second output of the main control unit 104 is electrically connected to the current sampling terminal.

In this solution, the auxiliary boosting unit 105 is also electrically connected to the input capacitor 109 and the output power supplying capacitor 108. The input capacitor 109 is arranged between the input of the auxiliary boosting unit 105 and the output of the auxiliary winding unit 106. The output power supplying capacitor 108 is arranged between the output of the auxiliary boosting unit 105 and the input of the main control unit 104. The input capacitor 109 and the output power supplying capacitor 108 are electrically connected to the common ground.

Figure 2:
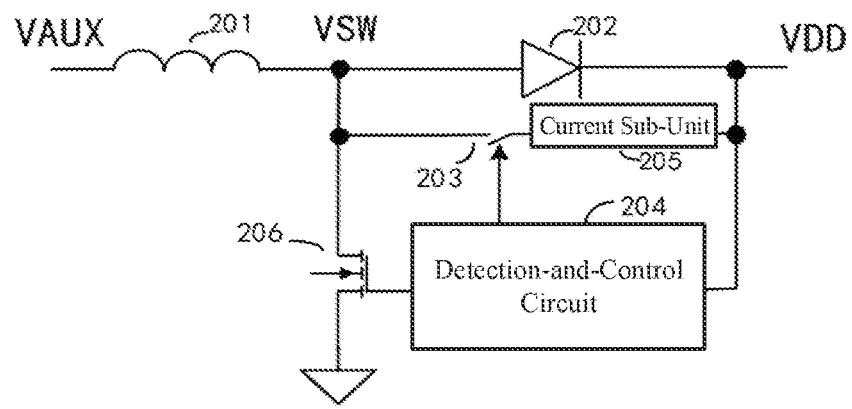
FIG. 2 is a schematic view illustrating an embodiment of an auxiliary boosting unit of the present disclosure.

As shown in FIG. 2, the auxiliary boosting unit 105 includes at least an inductor 201, a first diode 202, a first switch 206, a second switch 203, a detection-and-control circuit 204 and a current sub-unit 205.

A first terminal of the inductor 201 is configured to be the input of the auxiliary boosting unit 105, and a second terminal of the inductor 201 is electrically connected to an anode of the first diode 202, a first terminal of the first switch 206, and a second terminal of the second switch 203, respectively.

The anode of the first diode 202 is electrically connected to the second terminal of the inductor 201. A cathode of the first diode 202 is configured to be the output of the auxiliary boosting unit 105 and is electrically connected to an input of the current sub-unit 205 and an input of the detection-and-control circuit 204, respectively.

The first terminal of the first switch 206 is electrically connected to the second terminal of the inductor 201, the anode of the first diode 202, and the second terminal of the second switch 203, respectively. A second terminal of the first switch 206 is electrically connected to the common ground, and a third terminal of the first switch 206 is electrically connected to a first output of the detection-and-control circuit 204.

A first terminal of the second switch 203 is electrically connected to an output of the current sub-unit 205. The second terminal of the second switch 203 is electrically connected to the second terminal of the inductor 201, the anode of the first diode 202, and the first terminal of the first switch 206, respectively. A third terminal of the second switch 203 is electrically connected to a second output of the detection-and-control circuit 204.

The input of the detection-and-control circuit 204 is electrically connected to the cathode of the first diode 202 and the input of the current sub-unit 205, respectively. The first output of the detection-and-control circuit 204 is electrically connected to the third terminal of the first switch 206. The second output of the detection-and-control circuit 204 is electrically connected to the third terminal of the second switch 203.

The input of the current sub-unit 205 is electrically connected to the cathode of the first diode 202 and the input of the detection-and-control circuit 204, respectively. The output of the current sub-unit 205 is electrically connected to the first terminal of the second switch 203.

It should be additionally explained that the current sub-unit 205 in the solution of the present disclosure may be a different electrical component selected according to actual need of a circuit application, and may have a current limiting function or not, which is not specifically limited herein.

Figure 3:
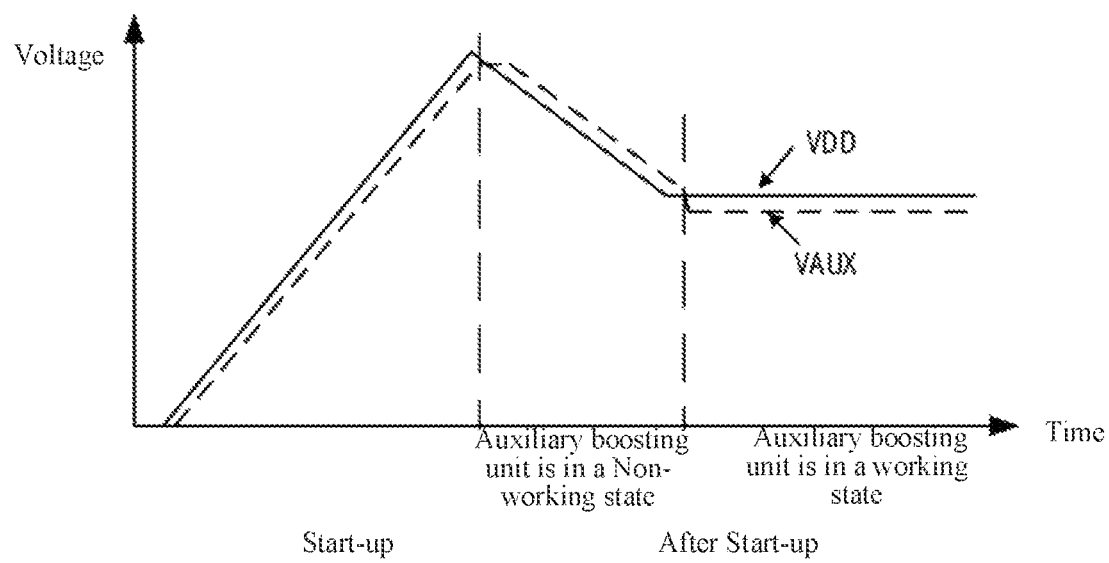
FIG. 3 is a schematic view illustrating changing voltage states of an input voltage VAUX and an output voltage VDD of the auxiliary boosting unit of FIG. 2 under different operating states of a main control unit.
Figure 4:
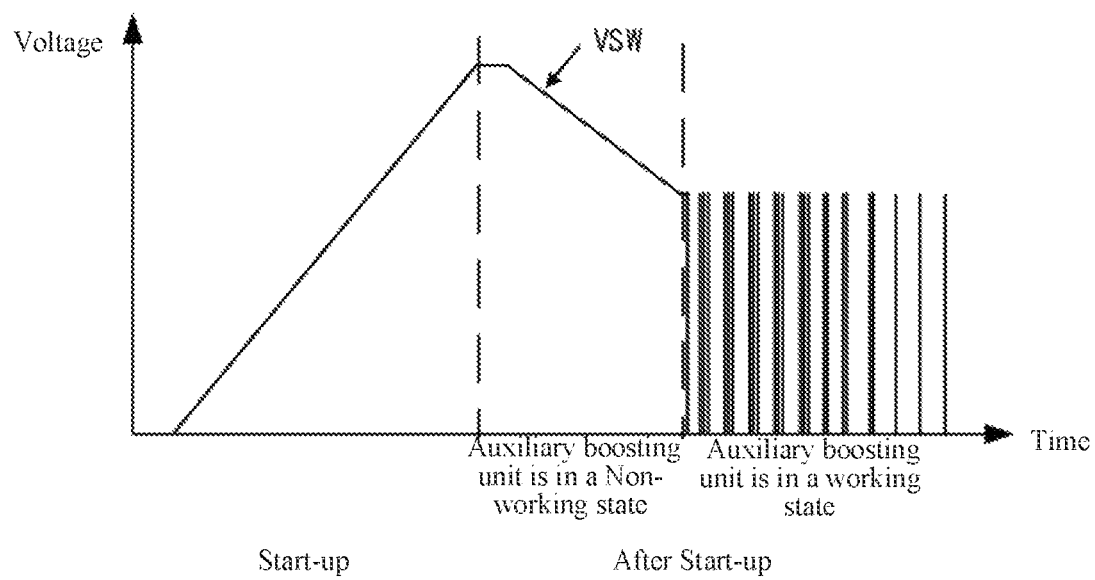
FIG. 4 is a schematic view illustrating a changing voltage state of a voltage VSW of the auxiliary boosting unit of FIG. 2 under different operating states of the main control unit.

FIG. 3 illustrates changing voltage states of an input voltage VAUX and an output voltage VDD of the auxiliary boosting unit 105 of FIG. 2 when the main control unit 104 is in a start-up state and after the start-up ends. FIG. 4 illustrates a changing voltage state of a voltage VSW between the inductor 201 and the first diode 202 in the auxiliary boosting unit 105 of FIG. 2 when the main control unit 104 is in the start-up state and after the start-up ends. It can be seen from the above two figures that during the startup of the main control unit 104, the main control unit 104 charges the output power supplying capacitor 108, and the voltage VDD of the output power supplying capacitor 108 is supplied to the auxiliary boosting unit 105 simultaneously. At the same time, the auxiliary boosting unit 105 through its internal logic circuit turns on the second switch 203, so that the voltage VAUX on the input capacitor 109 connected to the input of the auxiliary boosting unit 105 follows a change of the voltage VDD of the output power supplying capacitor 108. After the starting-up ends, the main control unit 104 stops charging the output power supplying capacitor 108, and before the output of the switch mode power supply converter is generated, the power supply voltage VDD of the main control unit 104 drops. At the same time, the input voltage of the auxiliary boosting unit, namely the voltage generated by the auxiliary winding unit 106, also drops along with the drop of the voltage VDD. Similarly, when the auxiliary boosting unit 105 is in a non-working state, the voltage VSW between the inductor 201 and the first diode 202 changes along with the change of the voltage VAUX. When the voltage VDD drops below the internal set value of the main control unit 104, the auxiliary boosting unit 105 starts to work, and adopts the self-adaptive conduction time control mode to self-adaptively adjust an average switching frequency of the terminal VSW, and converts the output voltage AUX of the auxiliary winding unit 106 into the power supply voltage VDD of the main control unit 104, and the power supply voltage VDD is ensured not to be lower than the internal set value of the main control unit 104.

Figure 5:
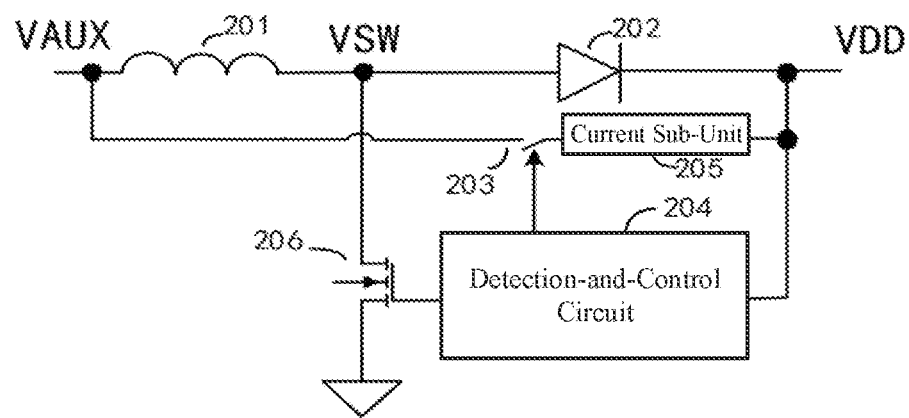
FIG. 5 is a schematic view illustrating another embodiment of the auxiliary boosting unit of the present disclosure.

As shown in FIG. 5, what is different from the embodiment shown in FIG. 2 is that the connection relationship in the auxiliary boosting unit 105 is different. In this embodiment, the first terminal of the inductor 201 functions as the input of the auxiliary boosting unit 105 and is electrically connected to the second terminal of the second switch 203, and the second terminal of the inductor 201 is electrically connected to the anode of the first diode 202 and the first terminal of the first switch 206, respectively.

The anode of the first diode 202 is electrically connected to the second terminal of the inductor 201 and the first terminal of the first switch 206, respectively. The cathode of the first diode 202 functions as the output of the auxiliary boosting unit 105, and is electrically connected to the input of the current sub-unit 205 and the input of the detection-and-control circuit 204, respectively.

The first terminal of the first switch 206 is electrically connected to the second terminal of the inductor 201 and the anode of the first diode 202, and the second terminal of the first switch 206 is electrically connected to the common ground. The third terminal of the first switch 206 is electrically connected to the first output of the detection-and-control circuit 204.

The first terminal of the second switch 203 is electrically connected to the output of the current sub-unit 205, the second terminal of the second switch 203 is electrically connected to the first terminal of the inductor 201, and the third terminal of the second switch 203 is electrically connected to the second output of the detection-and-control circuit 204.

The input of the detection-and-control circuit 204 is electrically connected to the cathode of the first diode 202 and the input of the current sub-unit 205, respectively. The first output of the detection-and-control circuit 204 is electrically connected to the third terminal of the first switch 206, and the second output of the detection-and-control circuit 204 is electrically connected to the third terminal of the second switch 203.

The input of the current sub-unit 205 is electrically connected to the cathode of the first diode 202 and the input of the detection-and-control circuit 204, respectively, and the output of the current sub-unit 205 is electrically connected to the first terminal of the second switch 203.

In this embodiment, the second terminal of the second switch 203 is electrically connected to the first terminal of the inductor 201, which functions as the input of the auxiliary boosting unit 105, thus providing a conduction path during the start-up of the main control unit 104. The voltage relationships between the input voltage VAUX of the auxiliary boosting unit 105 and the output voltage VDD of the auxiliary boosting unit 105 during the start-up and after the start-up ends are still the same as shown in FIG. 3 and FIG. 4.

Figure 6:
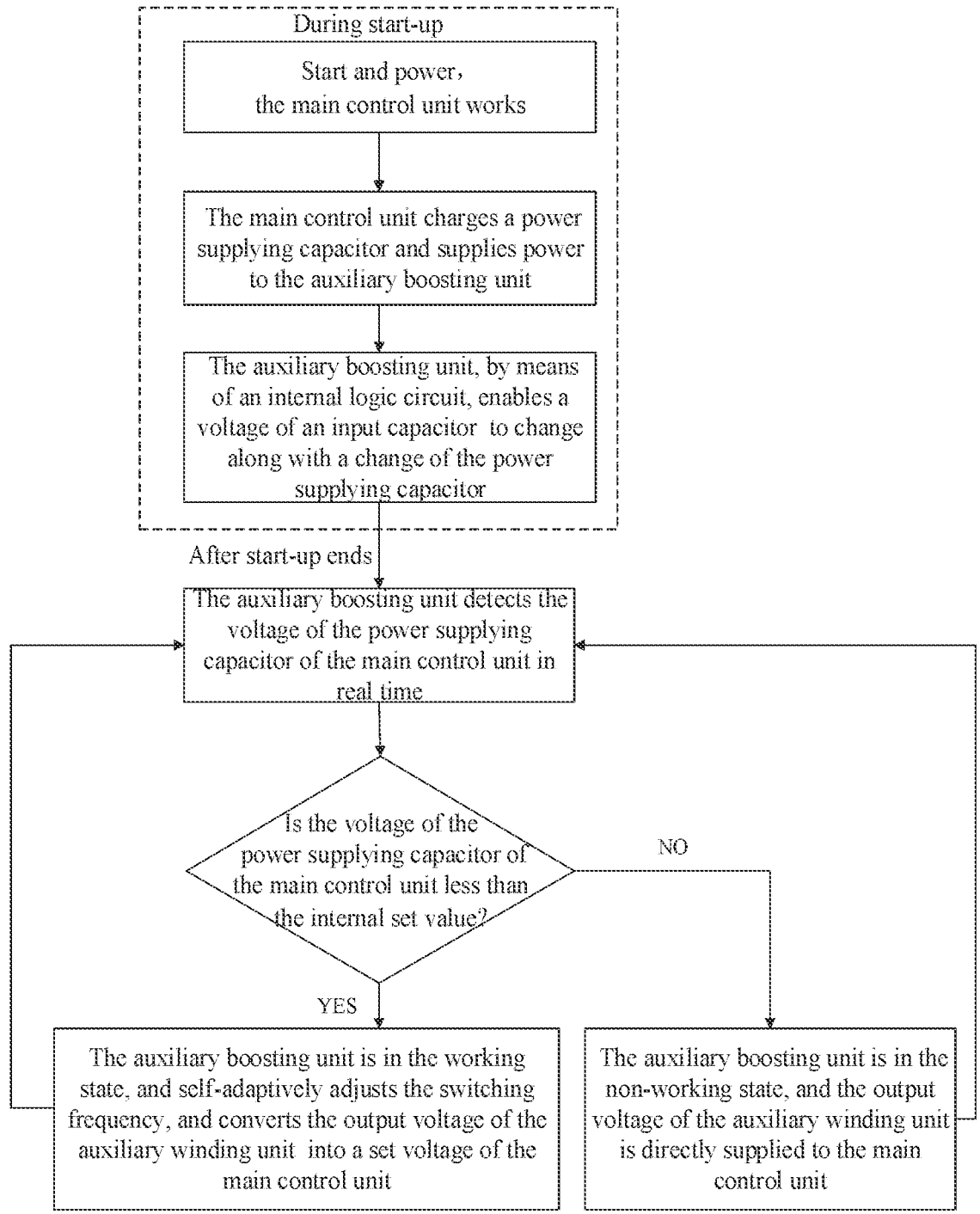
FIG. 6 is a schematic flowchart of a power supply control method for a switch mode power supply converter of the present disclosure.

The present disclosure also discloses a power supply control method for a switch mode power supply converter, which uses the power supply control circuit for the switch mode power supply converter described above. As shown in FIG. 6, the power supply control method includes the following steps.

In step S1, the circuit is started and powered, a main control unit 104 is started, and an internal set value of a main control unit 104 is calibrated.

In step S2, the main control unit 104 charges an output power supplying capacitor 108 and supplies power to an auxiliary boosting unit 105, and at this time, a voltage of an input capacitor 109 changes along with a change of a voltage of the output power supplying capacitor 108, and a positive-correlated trend exists therebetween.

In step S3, a start-up of the main control unit 104 ends, and the auxiliary boosting unit 105 detects the voltage of the output power supplying capacitor 108 in real time and compares the voltage of the output power supplying capacitor 108 with the internal set value of the main control unit 104.

If the voltage of the output power supplying capacitor 108 is not less than the internal set value of the main control unit 104, step S4 is executed, otherwise step S5 is executed.

In step S4, the auxiliary boosting unit 105 is in a non-working state, and an output voltage of the auxiliary winding unit 106 is directly supplied to the main control unit 104.

In step S5, the auxiliary boosting unit 105 is in a working state, and adopts a self-adaptive conduction time control mode to self-adaptively adjust its own average switching frequency based on a load state of the main control unit 104, that is, when a working load current of the main control unit 104 changes from a large current to a small current, at least one of the conduction time and the average switching frequency of the auxiliary boosting unit 105 also changes from a large value to a small value, and the output voltage of the auxiliary winding unit 106 is converted into the voltage of the output power supplying capacitor 108, so that the voltage of the output power supplying capacitor 108 is not less than the internal set value of the main control unit 104.

In summary, the power supply control circuit for the switch mode power supply converter and the corresponding power supply control method disclosed in the present disclosure can be adjusted and modified according to different switch mode power supply converters, to which the control circuit and the control method are applied, and have flexible and changeable application modes, rich application scenarios, and broad application prospects.

When the switch mode power supply converter supports the quick charge protocol or adopts widely ranged output voltages, the power supply control circuit of the present disclosure can convert the output voltage of the auxiliary winding into the voltage of the main control unit, and the auxiliary boosting unit can adopt the self-adaptive conduction time control mode, and by adjusting the average switching frequency, self-adaptively keeps the power supply voltage of the main control unit to be a relatively low value within a normal operating range. In this case, the configuration cost of hardware is reduced, the loss of the entire system is reduced, and the efficiency is improved, what's more, the requirements for the withstand voltage performance and the packaging process of the chip in the system are greatly reduced.

When the switch mode power supply converter does not support the quick charge protocol or does not adopt the widely ranged voltages, the power supply of the main control unit in the power supply control circuit of the present disclosure may be directly supplied by the auxiliary winding unit, or adopts a power supply mode with the auxiliary boosting unit. For the main control unit, the power supply mode may be selected freely and matched flexibly, thus making the application of the entire circuit structure more economical.

The present disclosure also provides a reference for other related issues in the art, and may be developed and expanded, and applied to related solutions of other switch mode power supply control technology in the art. The present disclosure has a very broad application prospect.

For those skilled in the art, it is obvious that the present disclosure is not limited to the details of the foregoing exemplary embodiments, and the present disclosure can be implemented in other specific forms without departing from the spirit and basic features of the present disclosure. Therefore, from any point of view, the embodiments should be regarded as exemplary but not restrictive embodiments. The scope of the present disclosure is defined by the appended claims rather than the above description, therefore all changes within the meaning and scope of equivalent elements of the claims are included in the present disclosure, and any reference signs in the claims should not be regarded as limitation on the claims.

In addition, it should be understood that although this specification is described in accordance with the embodiments, it does not mean that each embodiment includes only one independent technical solution. This narration of the specification is only for clarity, and those skilled in the art should regard the specification as a whole. The technical solutions in various embodiments may also be appropriately combined to form other implementations that can be understood by those skilled in the art.

What is claimed is:

1. A power supply control circuit for a switch mode power supply converter, applied in a power stage circuit of the switch mode power supply converter, and the power stage circuit comprising at least a magnetic element, a power switch transistor, a sampling resistor, and an output unit, wherein:

the power supply control circuit for the switch mode power supply converter comprises at least an auxiliary boosting unit, a main control unit, and an auxiliary winding unit;

the main control unit is electrically connected to the power switch transistor in the power stage circuit and the auxiliary boosting unit, respectively, and is configured to control the power switch transistor to turn on and to be off, and to supply power to the auxiliary boosting unit;

the auxiliary boosting unit is arranged between the main control unit and the auxiliary winding unit, and is configured to provide auxiliary power supply for the main control unit, and to adaptively adjust an average switching frequency of the auxiliary boosting unit based on a load state of the main control unit;

when the auxiliary boosting unit is in a working state, and when a power supply voltage of the main control unit is lower than an internal set value of the main control unit, the auxiliary boosting unit converts an output voltage of the auxiliary winding unit into the power supply voltage of the main control unit, to adjust the power supply voltage of the main control unit not to be lower than the internal set value of the main control unit; when the auxiliary boosting unit is in a non-working state, the output voltage of the auxiliary winding unit is directly supplied to the main control unit;

the auxiliary winding unit is electrically connected to the auxiliary boosting unit, and is configured to couple energy by means of the magnetic element in the power stage circuit, to generate an output voltage;

the auxiliary boosting unit is electrically connected to an input capacitor and an output power supply capacitor;

the input capacitor is arranged between an input of the auxiliary boosting unit and an output of the auxiliary winding unit, and the output power supply capacitor is arranged between an output of the auxiliary boosting unit and an input of the main control unit;

the input capacitor and the output power supplying capacitor are electrically connected to a common ground;

the auxiliary boosting unit comprises at least an inductor, a first diode, a first switch, a second switch, a detection-and-control circuit and a current sub-unit a first terminal of the inductor is configured to be the input of the auxiliary boosting unit, and a second terminal of the inductor is electrically connected to an anode of the first diode, a first terminal of the first switch, and a second terminal of the second switch, respectively;

the anode of the first diode is electrically connected to the second terminal of the inductor, and a cathode of the first diode is configured to be the output of the auxiliary boosting unit and is electrically connected to an input of the current sub-unit and an input of the detection-and-control circuit, respectively;

the first terminal of the first switch is electrically connected to the second terminal of the inductor, the anode of the first diode, and the second terminal of the second switch, respectively; a second terminal of the first switch is electrically connected to a common ground; a third terminal of the first switch is electrically connected to a first output of the detection-and-control circuit;

a first terminal of the second switch is electrically connected to an output of the current sub-unit the second terminal of the second switch is electrically connected to the second terminal of the inductor, the anode of the first diode, and the first terminal of the first switch, respectively; a third terminal of the second switch is electrically connected to a second output of the detection-and-control circuit;

the input of the detection-and-control circuit is electrically connected to the cathode of the first diode and the input of the current sub-unit, respectively; the first output of the detection-and-control circuit is electrically connected to the third terminal of the first switch; the second output of the detection-and-control circuit is electrically connected to the third terminal of the second switch; and the input of the current sub-unit is electrically connected to the cathode of the first diode and the input of the detection-and-control circuit, respectively; and the output of the current sub-unit is electrically connected to the first terminal of the second switch.

2. The power supply control circuit for the switch mode power supply converter according to claim 1, wherein:

one side of the magnetic element is electrically connected to the power switch transistor and the sampling resistor in sequence;

the sampling resistor is electrically connected to a common ground;

the power switch transistor is electrically connected to the sampling resistor, and a connection position therebetween is a current sampling terminal of the power supply control circuit for the switch mode power supply converter; and another side of the magnetic element is electrically connected to the output unit.

3. The power supply control circuit for the switch mode power supply converter according to claim 2, wherein:

a first output of the main control unit is electrically connected to the power switch transistor, and a second output of the main control unit is electrically connected to the current sampling terminal.

4. The power supply control circuit for the switch mode power supply converter according to claim 1, wherein the auxiliary winding unit comprises at least an auxiliary winding, a second diode and a first resistor;

a first terminal of the auxiliary winding is electrically connected to an anode of the second diode, and a second terminal of the auxiliary winding is electrically connected to a common ground;

the anode of the second diode is electrically connected to the first terminal of the auxiliary winding, and a cathode of the second diode is electrically connected to a first terminal of the first resistor;

the first terminal of the first resistor is electrically connected to the cathode of the second diode, and a second terminal of the first resistor is configured to be an output of the auxiliary winding unit and is electrically connected to an input of the auxiliary boosting unit.

5. A power supply control method of a switch mode power supply converter, using the power supply control circuit for the switch mode power supply converter of claim 1, comprising steps of:

starting and powering the circuit, starting the main control unit, and calibrating the internal set value of the main control unit;

the main control unit charging an output power supplying capacitor and supplying power to the auxiliary boosting unit, and at this time, a voltage of an input capacitor changing along with a change of a voltage of the output power supplying capacitor, and a positive-correlated trend existing therebetween;

a start-up of the main control unit ending, and the auxiliary boosting unit detecting the voltage of the output power supplying capacitor in real time and comparing the voltage of the output power supplying capacitor with the internal set value of the main control unit;

if the voltage of the output power supplying capacitor is not less than the internal set value of the main control unit, the auxiliary boosting unit being in the non-working state, and the output voltage of the auxiliary winding unit being directly supplied to the main control unit; otherwise the auxiliary boosting unit being in the working state, and adopting a self-adaptive conduction time control mode to adaptively adjust an average switching frequency of the auxiliary boosting unit based on the load state of the main control unit, so that the voltage of the output power supplying capacitor is not less than the internal set value of the main control unit.

6. The power supply control method of the switch mode power supply converter of claim 5, wherein, the auxiliary boosting unit adopting the self-adaptive conduction time control mode to adaptively adjust the average switching frequency of the auxiliary boosting unit based on the load state of the main control unit comprises:

when a working load current of the main control unit changes from a large current to a small current, at least one of a conduction time and the average switching frequency of the auxiliary boosting unit also changing from a large value to a small value, and the output voltage of the auxiliary winding unit being converted into the voltage of the output power supplying capacitor.

7. A power supply control circuit for a switch mode power supply converter, applied in a power stage circuit of the switch mode power supply converter, and the power stage circuit comprising at least a magnetic element, a power switch transistor, a sampling resistor, and an output unit, wherein:

the power supply control circuit for the switch mode power supply converter comprises at least an auxiliary boosting unit, a main control unit, and an auxiliary winding unit;

the main control unit is electrically connected to the power switch transistor in the power stage circuit and the auxiliary boosting unit, respectively, and is configured to control the power switch transistor to turn on and to be off, and to supply power to the auxiliary boosting unit;

the auxiliary boosting unit is arranged between the main control unit and the auxiliary winding unit, and is configured to provide auxiliary power supply for the main control unit, and to adaptively adjust an average switching frequency of the auxiliary boosting unit based on a load state of the main control unit;

when the auxiliary boosting unit is in a working state, and when a power supply voltage of the main control unit is lower than an internal set value of the main control unit, the auxiliary boosting unit converts an output voltage of the auxiliary winding unit into the power supply voltage of the main control unit, to adjust the power supply voltage of the main control unit not to be lower than the internal set value of the main control unit; when the auxiliary boosting unit is in a non-working state, the output voltage of the auxiliary winding unit is directly supplied to the main control unit;

the auxiliary winding unit is electrically connected to the auxiliary boosting unit, and is configured to couple energy by means of the magnetic element in the power stage circuit, to generate an output voltage;

the auxiliary boosting unit is electrically connected to an input capacitor and an output power supply capacitor;

the input capacitor is arranged between an input of the auxiliary boosting unit and an output of the auxiliary winding unit, and the output power supply capacitor is arranged between an output of the auxiliary boosting unit and an input of the main control unit;

the input capacitor and the output power supplying capacitor are electrically connected to a common ground;

the auxiliary boosting unit comprises at least an inductor, a first diode, a first switch, a second switch, a detection-and-control circuit, and a current sub-unit;

a first terminal of the inductor is configured to be the input of the auxiliary boosting unit and is electrically connected to a second terminal of the second switch, and a second terminal of the inductor is electrically connected to an anode of the first diode and a first terminal of the first switch, respectively;

the anode of the first diode is electrically connected to the second terminal of the inductor and the first terminal of the first switch, respectively; a cathode of the first diode is configured to be the output of the auxiliary boosting unit, and is electrically connected to the input of the current sub-unit and an input of the detection-and-control circuit, respectively;

the first terminal of the first switch is electrically connected to the second terminal of the inductor and the anode of the first diode, and a second terminal of the first switch is electrically connected to a common ground; a third terminal of the first switch is electrically connected to a first output of the detection-and-control circuit;

a first terminal of the second switch is electrically connected to an output of the current sub-unit, the second terminal of the second switch is electrically connected to the first terminal of the inductor, and a third terminal of the second switch is electrically connected to a second output of the detection-and-control circuit;

the input of the detection-and-control circuit is electrically connected to the cathode of the first diode and the current sub-unit, respectively; the first output of the detection-and-control circuit is electrically connected to the third terminal of the first switch, and the second output of the detection-and-control circuit is electrically connected to the third terminal of the second switch; and the input of the current sub-unit is electrically connected to the cathode of the first diode and the input of the detection-and-control circuit, respectively; and the output of the current sub-unit is electrically connected to the first terminal of the second switch.

* * * * *